(12) United States Patent
Lee et al.

(10) Patent No.: US 7,507,520 B2
(45) Date of Patent: Mar. 24, 2009

(54) COMPOSITION FOR FORMING A CONJUGATED POLYMER PATTERN AND PROCESS OF FORMING A CONJUGATED POLYMER PATTERN USING THE SAME

(75) Inventors: Sang Kyun Lee, Gyeonggi-Do (KR); Ki Yong Song, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 721 days.

(21) Appl. No.: 10/732,227

(22) Filed: Dec. 11, 2003

(65) Prior Publication Data
US 2004/0180984 A1  Sep. 16, 2004

(30) Foreign Application Priority Data
Dec. 11, 2002  (KR) ............. 10-2002-0078692
Oct. 2, 2003  (KR) ............. 10-2003-0068741

(51) Int. Cl.
G03F 7/00 (2006.01)
G03F 7/004 (2006.01)

(52) U.S. Cl. ............................. 430/270.1; 430/311
(58) Field of Classification Search ............ 430/270.1
See application file for complete search history.

(56) References Cited
U.S. PATENT DOCUMENTS

| 4,528,118 A | | 7/1985 | Murase et al. | |
| 4,716,098 A | * | 12/1987 | Mack et al. | 430/331 |
| 5,171,761 A | * | 12/1992 | Penco et al. | 522/141 |
| 5,725,994 A | * | 3/1998 | Kondo | 430/270.1 |
| 5,936,048 A | * | 8/1999 | Oishi et al. | 525/523 |
| 5,976,284 A | | 11/1999 | Calvert et al. | |
| 6,027,853 A | * | 2/2000 | Malik et al. | 430/270.1 |
| 6,042,987 A | * | 3/2000 | Kobayashi | 430/270.1 |

(Continued)

FOREIGN PATENT DOCUMENTS
JP  60-165786  8/1985

OTHER PUBLICATIONS

John A. Rogers et al., "Fabrication of Patterned Electroluminescent Polymers that Emit in Geometries with Feature Sizes into the Submicron Range", Applied Physics Letters, 1998, pp.294-296, vol. 73, No. 3, American Institute of Physics, USA.

(Continued)

*Primary Examiner*—Amanda C. Walke
(74) *Attorney, Agent, or Firm*—Buchanan Ingersoll & Rooney PC

(57) ABSTRACT

The present invention relates to a composition for forming a conjugated polymer pattern and a pattern formation process. More specifically, the present invention relates to a composition for forming a pattern of conjugated polymer, comprising a precursor polymer of a certain structure and a photobase generator, and a process of forming a pattern using the same. In accordance with the present invention, not only can a pattern of the conjugated polymer be formed with ease, but the pattern produced thereby can be used advantageously in organo-electric devices, for example, a memory device, a sensor, a solar cell, a storage battery, organic EL, and so forth. Also, when being used in an organic EL device, it shows not only a higher EL efficiency but a lower threshold voltage.

9 Claims, 5 Drawing Sheets 1. coating 2. exposure

3. Developing/Baking

U.S. PATENT DOCUMENTS

| | | | |
|---|---|---|---|
| 6,703,190 B2* | 3/2004 | Elian et al. | 430/324 |
| 2003/0152864 A1* | 8/2003 | Araki et al. | 430/270.1 |
| 2004/0023157 A1* | 2/2004 | Feiring et al. | 430/272.1 |

OTHER PUBLICATIONS

Francis Garnier et al., "All-Polymer Field-Effect Transistor Realizes by Printing Techniques", Science, 1994, pp. 1684-1686, vol. 265.

Allen J. Bard et al., "Scanning Electrochemical Microscopy. Introduction and Principles", Anal. Chem., 1989, pp. 132-138, vol. 61, The American Chemical Society, USA.

Scott Brittain et al., "Soft Lithography and Microfabrication", Physics World, May 1998, pp. 31-37.

Younan Xia et al., "Replica Molding with a Polysiloxane Mold Provides this Patterned Microstructure—Soft Lithography", Angew. Chem. Int. Ed., 1998, pp. 551-575,vol. 37, Wiley-VCH Verlag GmbH, Weinheim Germany.

* cited by examiner 1. coating precursor polymer
substrate 2. exposure

3. Developing/Baking conjugated polymer

Voltage-Current density (▼) and
Voltage-Luminance (○) of device by Comparative Example 1

Voltage- Current density (▲) and
Voltage-Luminance (□) of device by Example 4 dotted line : device produced by Comparative Example 1 solid line : device produced by Example 4

COMPOSITION FOR FORMING A CONJUGATED POLYMER PATTERN AND PROCESS OF FORMING A CONJUGATED POLYMER PATTERN USING THE SAME

This application claims priority from Korean Patent Application No. 2002-78692, filed on Dec. 11, 2002, and Korean Patent Application No. 2003-68741, filed on Oct. 2, 2003, in the Korean Intellectual Property Office, the disclosures of which are incorporated herein by reference in their entireties.

FIELD OF THE INVENTION

The present invention relates to a composition for forming a conjugated polymer pattern and a pattern formation process. More specifically, the present invention relates to a composition for forming a pattern of conjugated polymer, comprising a precursor polymer of a certain structure and a photobase generator, and a process of forming a pattern using the same.

BACKGROUND OF THE INVENTION

With the growth of the IT industry, π-conjugated polymers have been drawing much attention as materials for use in the fields of organic electroluminescence, micro-electronics, electro-optics, opto-electronics and photonics. There has been much effort to use π-conjugated polymers for many types of organoelectronic devices, for example, a memory device, a sensor, a solar cell and a storage battery, because of the fact that polymers generally provide excellent mechanical properties as well as unique functions. But, for π-conjugated polymers to be used in an organoelectronic device, developing an efficient patterning technique is a prerequisite. In the prior art, for forming a pattern of monomolecular materials, chemical vapor deposition (CVD) or sputtering techniques have been used, but those techniques are not applicable to polymeric materials.

In this regard, there were various attempts to provide processes of forming a pattern of π-conjugated polymer and several techniques have been reported so far, such as deposition of the scanning electrochemical microscope (see: A. J. Bard, *Anal. Chem.* 1989, 61, 132), screening-printing (see: F. Ganier, *Science*, 1994, 265, 1684), microcontact printing (see: S. Brittain, *Phys. World*, 1998, 11, 31), micromoding in capillaries (see: J. Rogers, *Appl. Phys. Lett.* 1998, 73, 294) and soft lithography (see: Y. Xia, *Angew. Chem. mnt. Ed.* 1998, 37, 550). These techniques, however, have a common drawback of requiring additional precision equipment, so it is very hard to put them into practical use.

Also, photolithography techniques using a photochemical reaction were suggested for patterning π-conjugated polymer. For example, Japanese Laid-Open Publication No. 60-165,786 disclosed a formation of polyacetylene pattern via photopolymerization, wherein an acetylene monomer solution is spin-coated onto a substrate, the coating film is partially exposed to UV light under a photomask, and then subsequently developed to form a desired pattern. However, this process has been revealed defective in that patterns with high resolution cannot be easily obtained since crystallization of acetylene monomer, occurring often during the coating process, makes it difficult to form a film coated evenly. In addition, U.S. Pat. No. 4,528,118 discloses a process for preparing conjugated polymer by using sulfonate polymer as a precursor, which can be converted into a conjugated polymer through thermal elimination. But, this process was inherently intended to form a film, not a pattern so it cannot be a suitable solution for the prior art. U.S. Pat. No. 5,976,284 discloses a process for patterning a conjugated polymer, wherein a photoresist is applied onto a layer of conjugated polymer (e.g. polypyrrole), followed by exposure, developing and selective dry etching, to produce a patterned conducting film. But this process is not considered to be practical because the conjugated polymer is highly restricted in its structure so as to permit the selective etching and finding an optimum etching gas is difficult and requires much time and cost.

Thus, there is a strong need for a convenient and efficient process of forming a pattern of conjugated polymer.

SUMMARY OF THE INVENTION

The present invention features a process of forming a clear pattern with high resolution using a composition comprising a precursor of conjugated polymer having a certain chemical structure and a photobase generator.

In accordance with one aspect of the present invention, there is provided a composition for forming a conjugated polymer pattern, comprising a precursor polymer having a repeating unit represented by the following formula (1) and a photobase generator:

wherein,
R is an aromatic monocyclic hydrocarbon, an aromatic polycyclic hydrocarbon, an acyclic unsaturated hydrocarbon, or a monocyclic unsaturated heterocyclic compound containing one or more hetero atom(s); and
X is Br, Cl, or I.

In accordance with another aspect of the present invention, there is provided a process of forming a conjugated polymer pattern, comprising the steps of:
(i) coating a substrate with a coating solution prepared by dissolving the inventive composition in an organic solvent, to form a coating film;
(ii) exposing the coating film to light under a photomask; and
(iii) developing the exposed coating film with an organic developer, to form a desired pattern.

All of the above features and other features of the present invention can be successfully achieved from the present invention described in the following.

DETAILED DESCRIPTION OF PREFERRED EMBODIMENTS OF THE INVENTION

Figure 1:
FIG. 1 is a schematic view showing a pattern formation process of the present invention.
Figure 1:
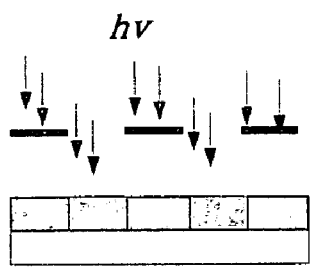
Figure 1:

The following is a detailed description of an inventive composition for forming a conjugated polymer pattern.

The composition of the present invention comprises a precursor polymer having a repeating unit represented by formula (1) and a photobase generator:

(1)

wherein,

R is an aromatic monocyclic hydrocarbon, an aromatic polycyclic hydrocarbon, an acyclic unsaturated hydrocarbon, or a monocyclic unsaturated heterocyclic compound; and X is Br, Cl, or I.

Under a presence of an excessive amount of base, the halogen moiety in the precursor polymer of formula (1), X, is detached to form a double bond, and thereby the precursor is converted into conjugated polymer. In the above formula (1), aromatic monocyclic hydrocarbon can be exemplified by phenyl and derivatives thereof; aromatic polycyclic hydrocarbon can be exemplified by fluorene and derivatives thereof; acyclic unsaturated hydrocarbon can be exemplified by vinyl and derivatives thereof; and monocyclic unsaturated heterocyclic compound contains one or more heteroatom(s) such as N, O, and S and can be exemplified by thiophene and derivatives thereof. The weight-average molecular weight of the precursor polymer ranges from 5,000 to 100,0000 and polydispersity (or molecular weight distribution) thereof ranges from 1.1 to 3.0.

Typically, such halogenated precursor polymer as represented in formula (1) can be obtained by the use of Gilch method (See: J. Polym. Sci., Part A-1: Polym. Chem. 1996, 4, 1337), which has been widely used in production of vinylene-based conjugated polymer. For example, it can be prepared by the following Reaction Scheme under the presence of a base in an amount less than its equivalent:

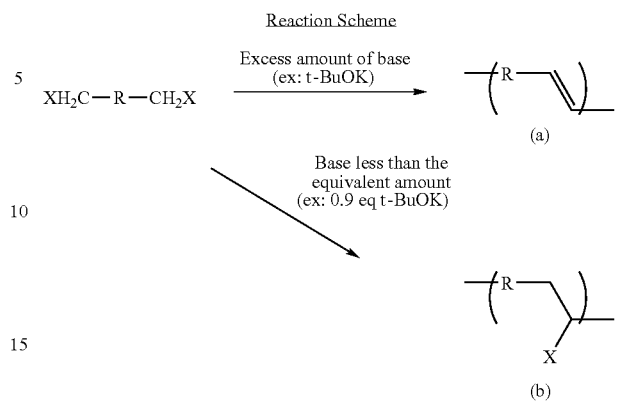

Reaction Scheme

The precursor obtained by the above scheme (b) shows good solubility to an organic solvent. But, when converted into a conjugated form by detachment of halogene group under an excessive amount of base via the scheme (a), it shows a drastically diminished solubility.

The photobase generator useful in the composition of the present invention can be any of the conventional photobase generators well known in the art, while the photobase generator having the structure represented in formula (2) is most preferred.

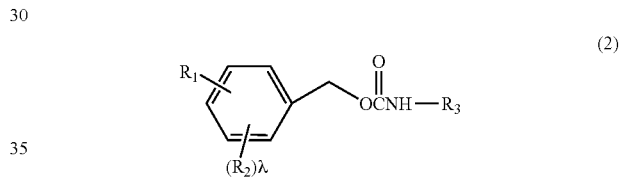

(2)

wherein, $R_1$ is a hydrogen, $C_{1-10}$ alkyl or alkoxy group, halogen group, or $C_{1-10}$ alkyl or alkoxy group comprising one or more Si atoms;

$R_2$ is a nitro group(s) (—$NO_2$) at either or both ortho-positions of the benzene ring;

$R_3$ is a phenyl group, naphthalene group or $C_{1-10}$ linear or cyclic alkyl group; and i is 1 or 2.

Upon exposure to light, the photobase generator of formula (2) undergoes a photoreaction according to such a reaction mechanism as depicted below, to generate base:

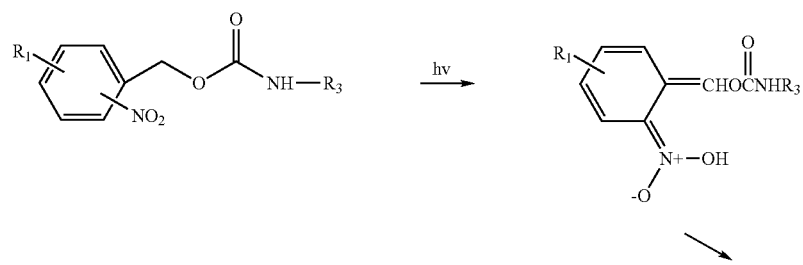

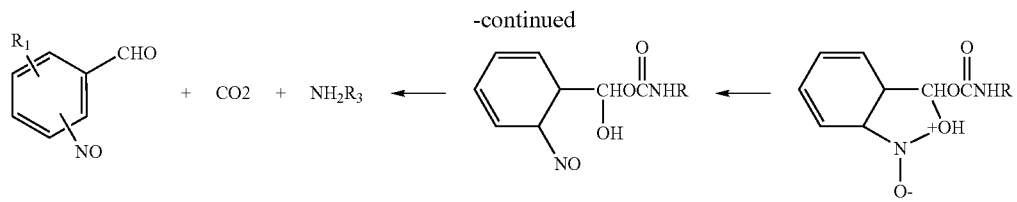

According to the present invention, a desired pattern of the conjugated polymer can be obtained by the process that comprises the steps of: (i) coating a substrate with a coating solution prepared by dissolving in organic solvent the composition of the present invention, to form a coating film; (ii) exposing the film to light under a photomask; and (iii) developing the exposed coating film with organic developer.

The organic solvent used in step (i), is not particularly limited, but can be selected from the group consisting of chloroform, ethyleneglycolmonomethylether, ethyleneglycolmonoethylether, methylcellosolveacetate, ethylcellosolveacetate, diethyleneglycolmonomethylether, diethyleneglycolmonoethylether, propyleneglycolmethyletheracetate, propyleneglycolpropyletheracetate, diethyleneglycoldimethylether, ethyl lactate, toluene, xylene, methylethylketone, cyclohexanone, 2-heptanone, 3-heptanone, 4-heptanone and mixtures thereof. Further, in addition to the main solvent as described above, there can be used one or more co-solvent(s) that are selected from the group consisting of N-methylformamide, N,N-dimethylformamide, N-methylacetamide, N,N-dimethylacetamide, N-methylpyrrolidone and dimethylsulfoxide, in order to enhance the characteristics of coating film.

In step (i), the composition of the present invention is dissolved in the organic solvent in such an amount that the resulting coating solution comprises 3-30 parts by weight of a precursor polymer based on 100 parts by weight of the organic solvent, and 0.1-2 parts by weight of a photobase generator based on 100 parts by weight of the precursor polymer. A co-solvent can be used in an amount of 0-10 parts by weight, based on 100 parts by weight of the main solvent.

The substrate used in step (i) is not particularly limited, and, for example, it can be made of inorganic materials such as silicon and glass; organic materials such as plastic; or composite materials comprising both organic and inorganic matter. Coating methods applicable to step (i) can be exemplified by, but are not limited to, spin coating, roll coating, dip coating, spray coating, flow coating and screen printing, while spin coating is most preferred.

In step (ii), the coating film obtained from step (i) is exposed to a light source under a photomask. If necessary, before or after the exposure, the film can be prebaked under a temperature of 60 to 150° C. for 1 to 20 minutes.

The light source used in step (ii) is not particularly limited, but UV light of a wavelength ranging from 220 nm to 450 nm is preferred. Upon exposure, the photobase generator generates excessive amount of base, under the presence of which the halogen group (X) of the precursor polymer is detached to produce a conjugated polymer as shown in the above Reaction Scheme (a), and thereby, a significant difference in the solubilities between exposed and unexposed areas can be made.

In developing step (iii), the coating film exposed in step (ii) is developed using any organic solvent usable in step (i).

Preferably, the developer is the same solvent as used in step (i). Optionally, after development, the obtained pattern may be baked at 90-130° C.

In accordance with the present invention, not only can a pattern of the conjugated polymer be formed with ease, but the pattern produced thereby can be used advantageously in an organo-electric device, for example, a memory device, a sensor, a solar cell, a storage battery, organic EL, and so forth and, when being used in an organic EL device, it shows not only a higher EL efficiency but a lower threshold voltage.

The present invention can be more clearly understood with reference to the following examples. However, it should be understood that the following examples are not intended to restrict the scope of the present invention in any manner.

PRODUCTION EXAMPLE 1

Preparation of poly{(1-bromoethyl)-1,4-phenylene}

Potassium-tert-butoxide (t-BuOK, 0.37 mmol) dissolved in 3 ml of THF and 1,4-bromomethylbenzene (0.92 mmol) dissolved in 3 ml of THF were mixed by agitating them together at −30° C. in nitrogen atmosphere for 10 minutes. The mixture was then moved to room temperature and further agitated for 2 hrs. Thereafter, the mixture which was poured to iced methanol to obtain a precipitate, was dissolved in chloroform and subjected to reprecipitation using methanol. After repeating such reprecipitation procedure two or three times, the resulting precipitate was vacuum-dried for 24 hrs to form the title polymer. The polymer had a weight average molecular weight (MW) of 64,000 and its molecular weight distribution (MWD) was 1.6. The results of NMR analysis of the polymer are as follows:

NMR (CDCl$_3$, ppm): 5.56-5.15 (CHBr), 3.97-2.96 (CH$_2$) and 7.45-6.61 (ArH).

PRODUCTION EXAMPLE 2

Preparation of poly{(1-bromoethyl)-9,9-di-n-hexylfluorenylene}

Potassium-tert-butoxide (t-BuOK, 0.53 mmol) dissolved in 5 ml THF and 2,7-dibromomethyl-9,9-di-n-hexylmethylfluorene (0.87 mmol) dissolved in 8 ml THF were mixed by agitating them together at −30° C. in nitrogen atmosphere for 15 minutes. After being further agitated for 3 hrs at room temperature, the mixture was poured into iced methanol to obtain a precipitate, which was dissolved in chloroform and subjected to reprecipitation using methanol two or three times. And then, the resulting precipitate was vacuum-dried for 24 hrs to form the title polymer. The polymer obtained had a weight average MW of 52,000 and its MWD was 1.5. The results of NMR analysis of the polymer are as follows:

NMR (CDCl$_3$, ppm): 5.58-5.81 (CHBr), 3.81-2.62 (CH$_2$), 6.81-7.22 (m, 6H, fluorenyl aromatic) and 1.22-1.41 (m, hexyl H).

PRODUCTION EXAMPLE 3

Preparation of {Poly(1-bromoethyl)-2,5-thienylene}

Potassium-tert-butoxide (t-BuOK, 0.58 mmol) dissolved in 6 ml THF and 2,5-dibromomethylthiophene (0.87 mmol) dissolved in 8 ml THF were mixed by agitating them together at −30° C. in nitrogen atmosphere for 15 minutes. After being further agitated for 3 hrs at room temperature, the mixture was poured into iced methanol to obtain a precipitate, which was dissolved in chloroform and subjected to reprecipitation using methanol two or three times. And then, the resulting precipitate was vacuum-dried for 24 hrs to form the title polymer. The polymer obtained had a weight average MW of 43,000 and its MWD was 1.3. The results of NMR analysis of the polymer are as follows:

NMR (CDCl$_3$, ppm): 3.4-3.5 (CHBr), 4.7-5.01 (CH$_2$) and 6.81-7.22 (m, 2H, thyenyl).

EXAMPLE 1

Figure 2:
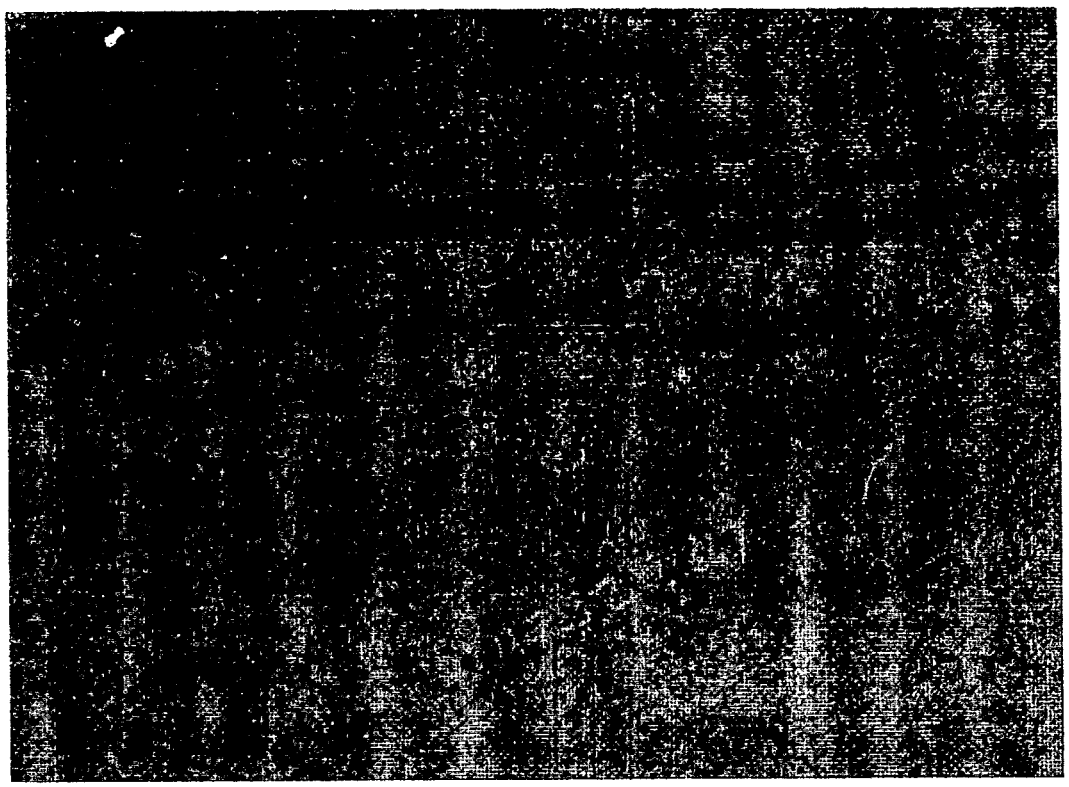
FIGS. 2 to 5 are SEM photographs showing patterns formed according to the process of the present invention.
Figure 3:
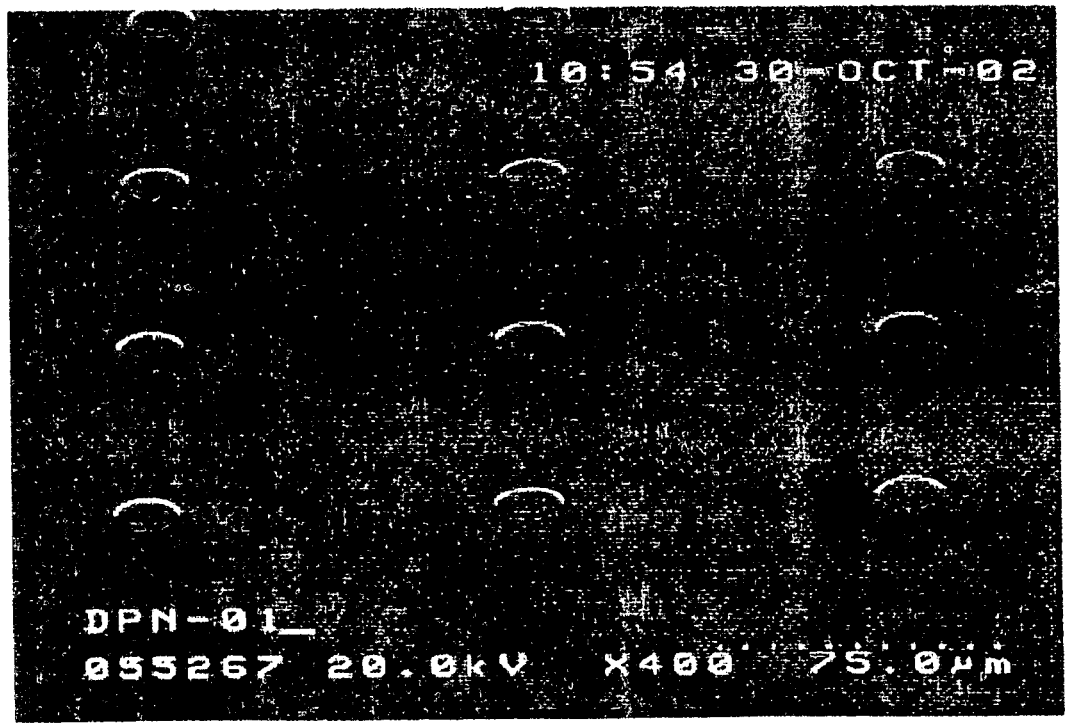

2 g of poly{(1-bromoethyl)-1,4-phenylene} obtained from Production Example 1 and 0.01 g of 2-nitrobenzyloxycarbonylcyclohexylamine were dissolved in 20 g of toluene. The solution was applied to a silicone wafer by spin coating at 300 rpm for 45 seconds. The coated film thus formed was baked at 100° C. for 30 seconds and then exposed to light under a photomask with a desired pattern by the use of a broad range Hg Arc lamp. After exposing, the coating film was further baked on a hot plate for 60 seconds. Subsequently, the coating film was developed with toluene for 60 seconds, followed by spin drying to afford a 10 µm line and space negative pattern and a circular pattern of 15 µm in diameter (see: FIGS. 2 and 3).

EXAMPLE 2

Figure 4:

3 g of poly{(1-bromoethyl)-9,9-di-n-hexylfluorenylene} obtained from Production Example 2 and 0.02 g of 2-nitrobenzyloxycarbonylcyclohexylamine were dissolved in 18 g of toluene. The solution was applied to a silicone wafer by spin coating at 300 rpm for 45 seconds. The coated film thus formed was baked at 100° C. for 30 seconds and then exposed to light under a photomask with a desired pattern by the use of a broad range Hg Arc lamp. After exposing, the coating film was further baked on a hot plate for 60 seconds. Subsequently, the coating film was developed with toluene for 60 seconds, followed by spin drying to afford a 20 µm line and space negative pattern (see: FIG. 4).

EXAMPLE 3

Figure 5:
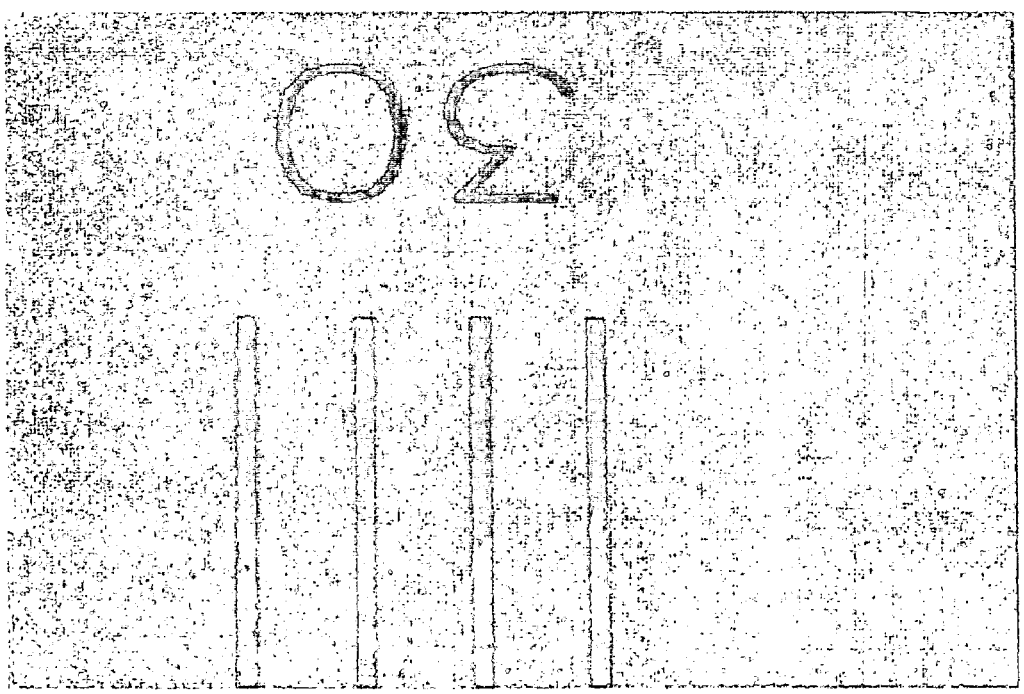

3 g of poly{(1-bromoethyl)-2,5-thienylene} obtained from Production Example 3 and 0.02 g of 2-nitrobenzyloxycarbonylcyclohexylamine were dissolved in 18 g of toluene. The solution was applied to a silicone wafer by spin coating at 300 rpm for 45 seconds. The coated film thus formed was baked at 100° C. for 30 seconds and then exposed to light under a photomask with a desired pattern by the use of a broad range Hg Arc lamp. After exposing, the coating film was further baked on a hot plate for 60 seconds. Subsequently, the coating film was developed with toluene for 60 seconds, followed by spin drying to afford a 30 µm line and space negative pattern (see: FIG. 5).

EXAMPLE 4

Polystyrenesulfonic acid (PEDOT) was spin-coated onto transparent ITO substrate and baked at 100° C. for 5 hrs to obtain 30 nm of a hole injection layer. On this layer, a coating solution prepared by dissolving 2 g of poly{(1-bromoethyl)-2,5-thienylene} and 0.02 g of 2-nitrobenzyloxycarbonylcyclohexylamine in 18 g of toluene was spin-coated at 300 rpm for 45 seconds. After prebaked at 100° C. for 30 seconds, the film was irradiated with Hg Arc lamp and baked again on a hot plate for 60 seconds to form a luminescent layer, on which calcium and aluminum (Ca/Al=100 nm/100 nm) was vapor-deposited at 100° C. for 5 minutes to obtain sample device with the width of 0.2 cm$^2$.

Figure 6:
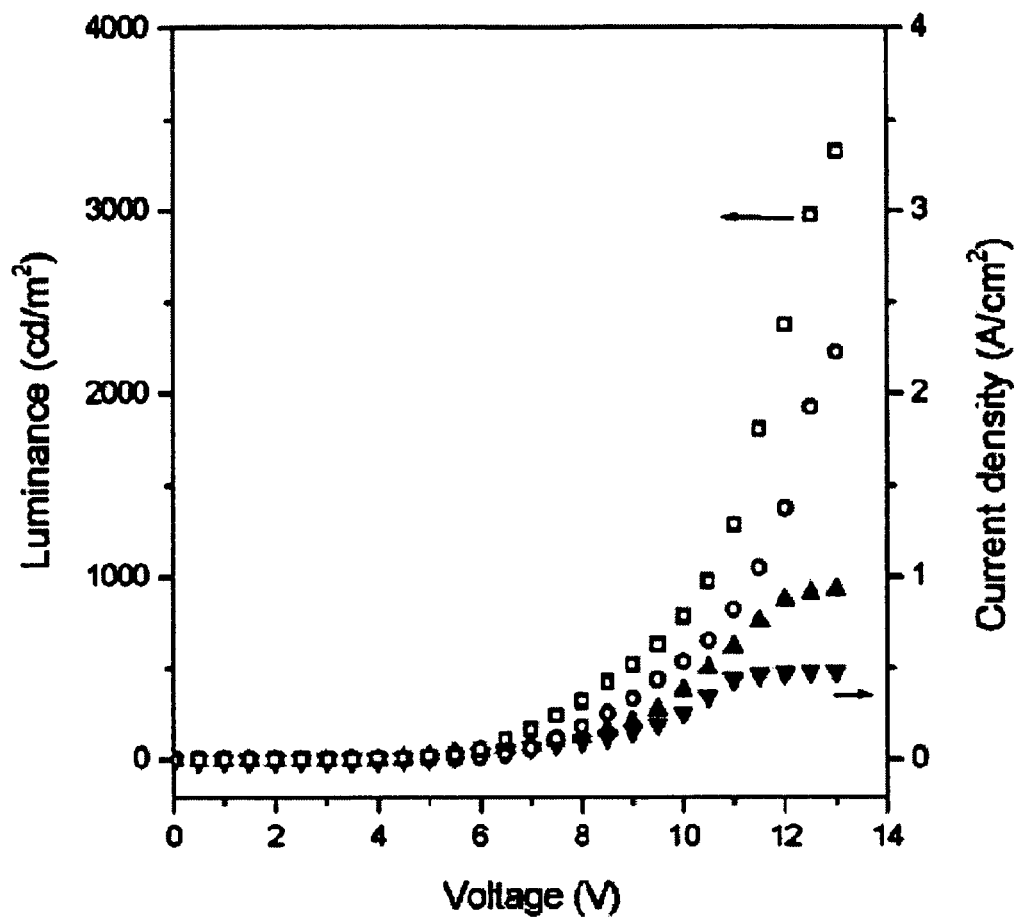
FIG. 6 is a graph illustrating the relation between voltage-current density and voltage-luminance for each device that includes conjugated polymer film of the present invention or conjugated polymer film of the prior art.
Figure 7:
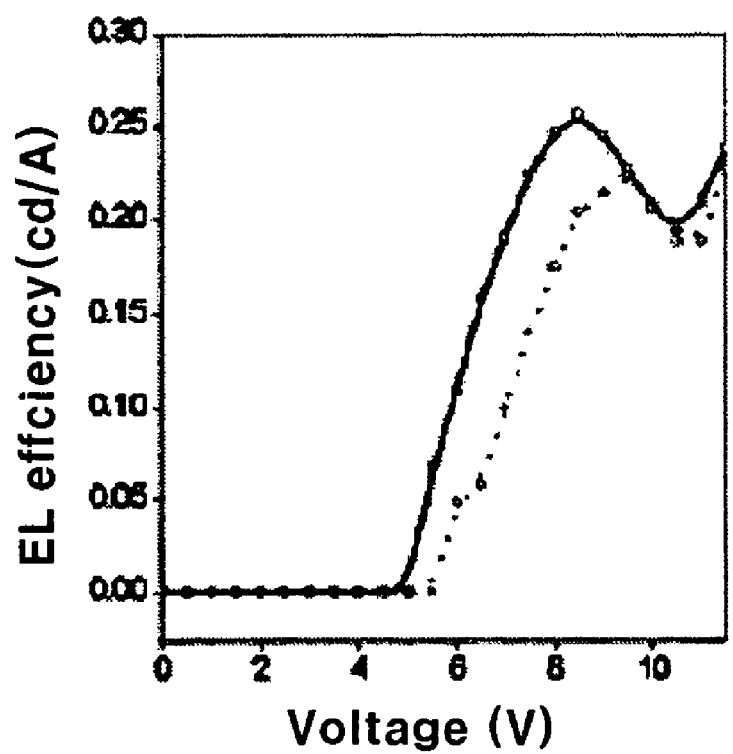
FIG. 7 is a graph illustrating the relation between voltage and EL-efficiency for each device that includes conjugated polymer film of the present invention or conjugated polymer film of the prior art.

With this sample device, electrical properties were determined and, in FIGS. 6 and 7 were provided graphs illustrating the relation between voltage and current density, and the relation between voltage and luminance respectively.

COMPARATIVE EXAMPLE 1

Except for using 2 g of poly{(1-bromoethyl)2,5-thienylene} prepared from production example 3 instead of composition of a polymer precursor and a photobase generator, and carrying out thermal elimination at 300° C. for 6 hours in vacuum oven to prepare a luminescent layer, a sample device was obtained in the same way of Example 4. With this sample device, electrical properties were determined and, in FIGS. 6 and 7 were provided graphs illustrating the relation between voltage and current density, and the relation between voltage and luminance respectively.

From the result of Example 4 and Comparative Example 1, it can be seen that not only does the device of the present invention show higher value of current density and luminance but it has lower threshold voltage which make it possible for the device to be driven with a lower voltage.

As described above, by the use of the inventive composition, conjugated polymer patterns can be obtained with ease and efficiency. The conjugated polymer patterns produced according to the present invention may be employed in manufacturing organoelectronic devices such as a memory device, a sensor, a solar cell, a storage battery, and so on. Especially, when the pattern of the present invention is adopted in an organic EL device, its EL efficiency is quite high while its threshold voltage is low, compared with the prior art.

It will be apparent to one skilled in the art that various changes and modifications can be made, and equivalents employed without departing from the scope of the claims.

The invention claimed is:

1. A composition for forming a pattern of conjugated polymer, comprising a precursor polymer having a repeating unit represented by the following formula (1) and a photobase generator:

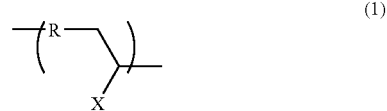

(1)

wherein,
R is an aromatic monocyclic hydrocarbon, an aromatic polycyclic hydrocarbon, an acyclic unsaturated hydrocarbon or a monocyclic unsaturated heterocyclic compound; and
X is Br, Cl or I.

2. The composition of claim 1, wherein R of formula (1) is phenyl and derivatives thereof; fluorene and derivatives thereof; vinyl and derivatives thereof; or thiophene and derivatives thereof.

3. The composition of claim 1, wherein the photobase generator has a compound represented by the following formula (2):

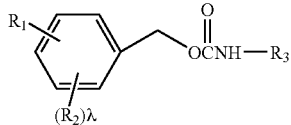
(2)

wherein,
- $R_1$ is a hydrogen, a $C_{1-10}$ alkyl or alkoxy group, a halogen group, or a $C_{1-10}$ alkyl or alkoxy group comprising one or more Si atoms;
- $R_2$ is a —$NO_2$ group(s) at either or both ortho-positions of the benzene ring;
- $R_3$ is a phenyl group, a naphthalene group, or a $C_{1-10}$ linear or cyclic alkyl group; and
- i is 1 or 2.

4. A process of forming a conjugated polymer pattern, comprising the steps of:
   (i) coating a substrate with a coating solution prepared by dissolving in an organic solvent a composition comprising a precursor polymer having a repeating unit represented by formula (1) and a photobase generator to form a coating film;
   (ii) exposing the coating film to light under a photomask; and
   (iii) developing the exposed coating film with an organic developer, to form a desired pattern:

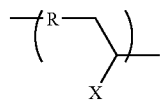
(1)

wherein,
- R is an aromatic monocyclic hydrocarbon, an aromatic polycyclic hydrocarbon, an acyclic unsaturated hydrocarbon, or a monocyclic unsaturated heterocyclic compound; and
- X is Br, Cl, or I.

5. The process of claim 4, wherein the photobase generator is a compound represented by formula (2):

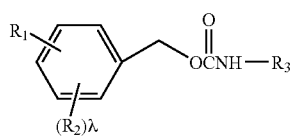
(2)

wherein,
- $R_1$ is a hydrogen, a $C_{1-10}$ alkyl or alkoxy group, a halogen group, or a $C_{1-10}$ alkyl or alkoxy group comprising one or more Si atoms;
- $R_2$ is a —$NO_2$ group(s) at either or both ortho-positions of the benzene ring;
- $R_3$ is a phenyl group, a naphthalene group, or a $C_{1-10}$ linear or cyclic alkyl group; and
- i is 1 or 2.

6. The process of claim 4, wherein the coating solution comprises the precursor polymer in an amount of 3-30 parts by weight based on 100 parts by weight of the organic solvent, and the photobase generator in an amount of 0.1-2 parts by weight based on 100 parts by weight of the precursor polymer.

7. The process of claim 4, wherein each of the organic solvent used in step (i) and the organic developer used in step (ii), independently, is selected from the group consisting of chloroform, ethyleneglycolmonomethylether, ethyleneglycolmonoethylether, methylcellosolveacetate, ethylcellosolveacetate, diethyleneglycolmonomethylether, diethyleneglycolmonoethylether, propyleneglycolmethyletheracetate, propyleneglycolpropyletheracetate, diethyleneglycoldimethylether, ethyl lactate, toluene, xylene, methylethylketone, cyclohexanone, 2-heptanone, 3-heptanone, 4-heptanone and a mixture thereof.

8. The process of claim 7, wherein, in addition to the organic solvent, a co-solvent is further used in an amount of 0 to 10 parts by weight relative to 100 parts by weight of the organic solvent, the co-solvent being selected from the group consisting of N-methylformamide, N,N-dimethylformamide, N-methylacetamide, N,N-dimethylacetamide, N-methylpyrrolidone, dimethylsulfoxide and a mixture thereof.

9. The process according to claim 4, wherein the exposure is accomplished by the use of UV light of a wavelength ranging from 220 nm to 450 nm.

* * * * *